United States Patent [19]
Suzuki et al.

[11] Patent Number: 5,317,438
[45] Date of Patent: May 31, 1994

[54] LIQUID CRYSTAL DISPLAY DEVICE AND METHOD OF PRODUCING THE SAME HAVING AN IMPROVED CONNECTION BETWEEN A FLEXIBLE FILM SUBSTRATE AND A DRIVE CIRCUIT SUBSTRATE

[75] Inventors: Takumi Suzuki, Atsugi; Yuichi Ota, Hadano; Yuji Narumi, Kanagawa; Youichiro Miyaguchi, Yokohama, all of Japan

[73] Assignee: Ricoh Company, Ltd., Tokyo, Japan

[21] Appl. No.: 935,297

[22] Filed: Aug. 26, 1992

[30] Foreign Application Priority Data

Aug. 29, 1991 [JP] Japan ................. 3-218734

[51] Int. Cl.⁵ .................. G02F 1/1343; G02F 1/1333
[52] U.S. Cl. ......................................... 359/88; 359/82
[58] Field of Search ................................. 359/82, 88

[56]      References Cited
       U.S. PATENT DOCUMENTS

| 4,697,885 | 10/1987 | Minowa et al. | 359/88 |
| 4,964,700 | 10/1990 | Takabayashi | 359/88 |
| 4,985,663 | 1/1991 | Nakatani | 359/88 |

FOREIGN PATENT DOCUMENTS

| 0149458 | 7/1985 | European Pat. Off. | 359/88 |
| 59-149327 | 8/1984 | Japan . | |
| 60-225828 | 11/1985 | Japan . | |
| 61-169160 | 7/1986 | Japan . | |
| 0215528 | 9/1986 | Japan | 359/88 |
| 62-35473 | 2/1987 | Japan . | |
| 64-54739 | 3/1989 | Japan . | |
| 1235923 | 9/1989 | Japan . | |
| 348222 | 3/1991 | Japan . | |
| 0184023 | 8/1991 | Japan | 359/88 |

Primary Examiner—William L. Sikes
Assistant Examiner—Huy Mai
Attorney, Agent, or Firm—Oblon, Spivak, McClelland, Maier & Neustadt

[57]  ABSTRACT

A liquid crystal display device using a flexible film as a panel substrate is produced such that the panel substrate is connected to a drive circuit substrate detachable for reuse, that transparent electrodes on the panel substrate are free of damage from conductive particles in the connection, and that a hotmelt adhesive for connection may be prevented by a simple arrangement from being deteriorated with outside air. The liquid crystal display device employs the panel substrates of flexible film, in which transparent electrode terminals formed on the panel substrate are connected to wiring terminals formed on a drive circuit substrate. A radiation-setting adhesive such as an ultraviolet-curing adhesive and a photo-setting adhesive is coated on a surface of a connection portion forming the transparent electrode terminals of the panel substrate. Conductive members are projectively provided on a surface of a connection portion forming the wiring terminals of the drive circuit substrate. A hotmelt adhesive covers a surface of the drive circuit substrate including the conductive members.

14 Claims, 5 Drawing Sheets

LIQUID CRYSTAL DISPLAY DEVICE AND METHOD OF PRODUCING THE SAME HAVING AN IMPROVED CONNECTION BETWEEN A FLEXIBLE FILM SUBSTRATE AND A DRIVE CIRCUIT SUBSTRATE

BACKGROUND OF THE INVENTION

1. Field of the Invention

The present invention relates to a liquid crystal display device and a process for producing it. More particularly, the invention relates to the connection between a connection terminal portion of a transparent electrode and an electrode connection portion formed on a drive circuit substrate in a liquid crystal display device having upper and lower substrates of flexible film.

2. Description of the Related Art

A conventional liquid crystal display device is formed such that a pair of panel substrates are laminated with a small gap between them and that a liquid crystal is filled in the gap. In such a liquid crystal display device, an anisotropic conductive film is used for connection of wiring terminals on a drive circuit substrate with transparent electrode terminals formed on a panel substrate. The anisotropic conductive film is a thermoplastic adhesive, a thermosetting adhesive, or an adhesive mass in which conductive particles are dispersed.

If an inspection finds a defect, the connection between the panel substrate and the drive circuit substrate is separated in order to allow the reuse of the substrates. There is a method known to enable the separation of the connection between the panel substrate and the drive circuit substrate, which uses two adhesives different in thermal hardening temperature for connection between the substrates. In this method, the substrates are connected at a first thermal hardening temperature. If an inspection finds a defect in a liquid crystal display unit with the substrate. thus connected, the connection is softened at a second temperature higher than the first thermal hardening temperature, to separate the drive circuit substrate from the panel substrate.

This connection method may be applied to a liquid crystal display device using a glass plate for panel substrate, but cannot be applied to those using a flexible film such as polymer film for panel substrate. A flexible film substrate reveals a low heat resisting temperature. For example, a polyester film has a glass transition point of 80° C. A substrate of polyester film would have a thermal expansion and contraction at a temperature over the glass transition point of polyester, for example about 130° C., which results in breakage of transparent electrodes (ITO: Indium Tin Oxide electrodes) on the substrate. If substrates are connected by the above-mentioned connection method using two adhesives different in thermal hardening temperature, a temperature difference of 20°-30° C. is necessary in thermal hardening temperature between the two adhesives. A thermoplastic resin such as polyester film has a softening point of about 130° C., while a thermosetting adhesive normally has a thermal hardening temperature of about 170° C. Therefore, the above connection method is not suitable for application to a separable connection of panel substrate.

Further, if a polyester is used as a panel substrate, a bonding strength between transparent electrodes (ITO) and the polyester substrate is lower than that between the transparent electrodes (ITO) and an anisotropic conductive film. Thus the transparent electrodes (ITO) would be stripped from the polyester substrate when the drive circuit substrate is separated from the polyester substrate for reuse. This causes difficulties in separation and in reuse of the substrates.

As explained above, conductive particles are dispersed for example in a hotmelt adhesive for connection. The conductive particles may be metal particles of nickel, solder, silver, or other metal, or, gold-plated plastic beads with a diameter of several $\mu$m to several ten's $\mu$m. If a panel substrate is made of glass, the conductive particles could be crushed upon heat press for connection between the panel substrate and the drive circuit substrate, thereby face-contacting with the transparent electrodes on the glass substrate. In contrast, if a panel substrate is made of polymer film, the conductive particles may damage a transparent electrode. For example, a conductive particle may break a transparent electrode and another particle may cause cracks in the transparent electrode, because the polymer film substrate is softer than the conductive particles. Such damages cause unstable contact between the polymer film substrate and the conductive particles due to a difference in thermal expansion and contraction between the materials after aging. This results in poor contact between the materials.

SUMMARY OF THE INVENTION

It is an object of the present invention to provide a liquid crystal display device using a flexible film as a panel substrate, in which the panel substrate is connected to a drive circuit substrate detachable for reuse, in which transparent electrodes on the panel substrate are free of damage from conductive particles in the connection, and in which a hotmelt adhesive for connection may be prevented by a simple means from being deteriorated by outside air, and to provide a process for producing such a liquid crystal display device.

The object of the present invention can be achieved by a liquid crystal display device in which a flexible film is used as a panel substrate and in which a transparent electrode terminal formed on the panel substrate is connected to a wiring terminal formed on a drive circuit substrate: wherein a radiation-setting adhesive is coated on a surface of a connection portion forming the transparent electrode terminal of the panel substrate; a conductive member is projectively provided on a surface of a connection portion forming the wiring terminal of the drive circuit substrate; and a hotmelt adhesive covers a surface of the drive circuit substrate including the conductive member.

The radiation-setting adhesive may be an ultraviolet-curing adhesive or a photo-setting adhesive.

The object of the present invention can also be achieved by a process for producing a liquid crystal display device in which a flexible film is used as a panel substrate and in which a transparent electrode terminal formed on the panel substrate is connected to a wiring terminal formed on a drive circuit substrate, comprising: coating a radiation-setting adhesive on a surface of a connection portion forming the transparent electrode terminal of the panel substrate; projectively providing a conductive member on a surface of a connection portion forming the wiring terminal of the drive circuit substrate; covering a surface of the drive circuit substrate including the conductive member with a hotmelt adhesive; heat-pressing the connection surfaces of the panel substrate and the drive circuit substrate positioned with each other at a temperature below a glass transition point of the panel substrate to remove most of the radiation-setting adhesive therefrom to connect the transparent electrode terminal through the conductive member projectively provided to the wiring terminal in a temporary fix state; inspecting the device; and alternatively selecting a step to follow based on a result of the inspection from effecting a final hardening of the radiation-setting adhesive for connection and from breaking the temporary fix state in order to connect the panel substrate to another drive circuit substrate in the above steps.

According to the present invention, connection is made as follows between the flexible film substrate and the drive circuit substrate. As a temporary fix, the hotmelt adhesive partially connects the conductive member projectively provided on the transparent electrode terminal surface to the wiring terminal on the drive circuit substrate side. If the device with the substrates thus connected passes an inspection, a final hardening is effected using radiation. If the device with the substrates temporarily connected is rejected upon inspection, the substrates are separated from each other without damage on the transparent electrode terminal surface. This separation enables the reuse of the transparent electrode substrate in combination with another drive circuit substrate.

The present invention has the following advantages in a liquid crystal display device using a flexible film as a panel substrate with a reusable connection between the panel substrate and a drive circuit substrate. Transparent electrodes on the panel substrate are free of damage from conductive particles upon separation of the substrates for reuse. A hotmelt adhesive for connection is prevented from being deteriorated by outside air. After an inspection, separation and final hardening may be readily conducted with use of radiation-setting adhesive for temporary fix as well as with use of hotmelt adhesive.

Further objects and advantages of the present invention will be apparent from the following description of the preferred embodiments of the invention as illustrated in the accompanying drawings.

DESCRIPTION OF THE PREFERRED EMBODIMENTS

There are embodiments according to the present invention explained below with reference to the accompanying drawings.

In the preferred embodiments, a liquid crystal display device employs a pair of flexible films for panel substrate, which is characterized in that a fluid radiation-setting adhesive such as an ultraviolet-curing adhesive and a photo-setting adhesive is provided on the transparent electrode terminal side for connection between transparent electrode terminals of panel substrate and wiring terminals of drive circuit substrate, that conductive particles are embedded in a surface of terminals on the drive circuit substrate side, that a hotmelt adhesive to be subject to heat-press for connection is provided on the surface, that the hotmelt adhesive is pressed for temporary fix onto the radiation-setting adhesive, that an inspection is carried out, and that, depending on a result of inspection, the fluid radiation-setting adhesive is hardened or the temporary fix is broken for reuse.

Figure 1:
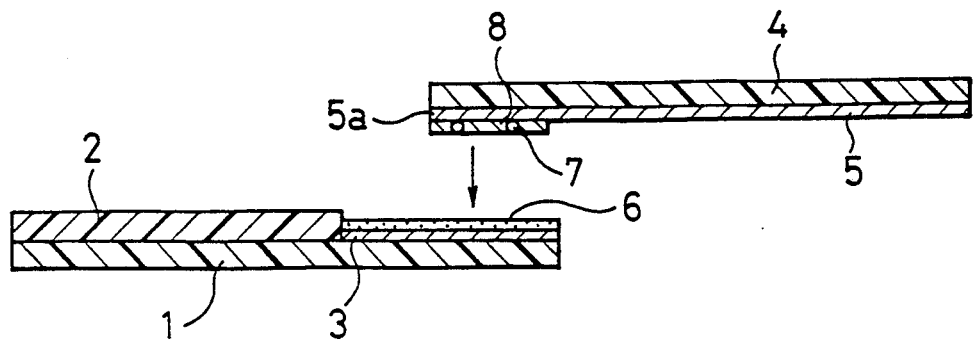
FIG. 1 is a schematic side view to show a state before connection between a panel substrate and a drive circuit substrate in the first embodiment according to the present invention.
Figure 2:
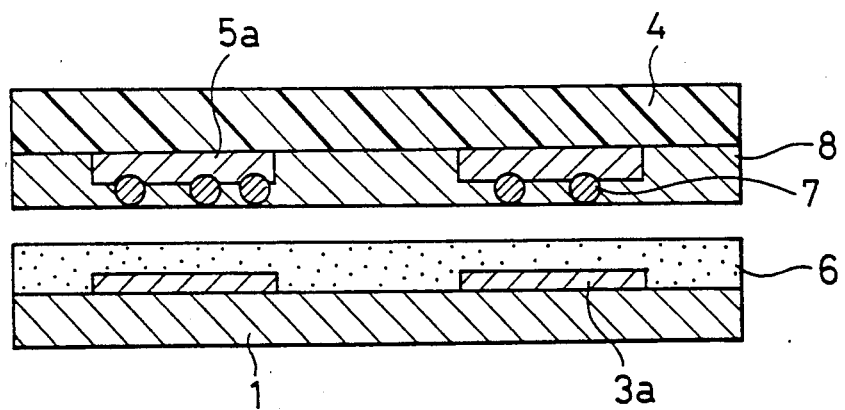
FIG. 2 is a partly enlarged drawing of the first embodiment as shown in FIG. 1.

FIGS. 1 and 2 show the first embodiment according to the present invention. FIG. 2 shows an enlarged portion of the connection illustrated in FIG. 1. A pair of polyester films 1, 2 are substrates. Transparent electrodes (ITO) 3 are formed on an inner surface of each substrate 1, 2. In this embodiment, x-axial and y-axial belt-like electrodes are formed on the lower substrate 1 and the upper substrate 2, respectively. A connection between the electrode terminals and wiring terminals 5a on a drive circuit substrate 4 is identical on the side of the lower substrate 1 and on the side of the upper substrate 2, and therefore attention is made to the connection on the side of the lower substrate 1 in the following explanation.

Terminals 3a of the transparent electrodes 3 are extended in an electrode taking-out portion of the lower substrate 1 to be connected to the terminals 5a of the wires 5 formed on the drive circuit substrate 4. An ultraviolet-curing adhesive 6 is provided on the terminals 3a of the transparent electrodes 3 by coating through a squeegee dispenser or by printing such as offset printing, screen printing, and the like. A thickness of the ultraviolet-curing adhesive 6 is not more than 100 µm.

The ultraviolet-curing adhesive 6 covers edges of both substrates 1, 4 since it is pressed out between the lower substrate 1 and the drive circuit substrate 4 onto the edges thereof upon heat-press as later described. The adhesive 6 is preferably coated or printed within the thickness of polyester film of 100 μm, which is a thickness of the upper substrate. Since the thickness of the adhesive 6 does not exceed that of the upper substrate, the upper substrate cannot be soiled with the adhesive upon connection of electrode taking-out portion on the upper substrate.

The wiring 5 is formed on the drive circuit substrate 4 using the polyester film by screen printing of conductive coating in which silver and carbon are mixed. Conductive particles 7 are embedded on the terminals 5a of the wiring 5. A hotmelt adhesive 8 is coated on the terminals 5a of the wiring 5 in which the conductive particles 7 are embedded. The wiring terminals 5a of mixture of silver and carbon are soft on the drive circuit substrate 4, so that the conductive particles 7 may be readily embedded in the wiring terminals 5a.

Figure 12:
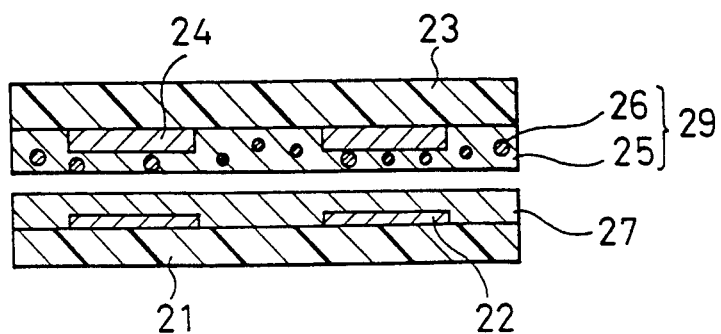
FIG. 12 is a sectional view to show an example of conventional connection between a panel substrate and a drive circuit substrate in a state before connection.

In the present invention, the conductive particles 7 are embedded on the surface of wiring terminals 5a as shown in FIG. 2, which is different from the arrangement of a conventional example as shown in FIG. 12. In the conventional example of FIG. 12, an anisotropic conductive film 29, in which conductive particles 26 are uniformly dispersed in a hotmelt adhesive 25, is disposed over wiring terminals 24 on a drive circuit substrate 23.

Figure 10:
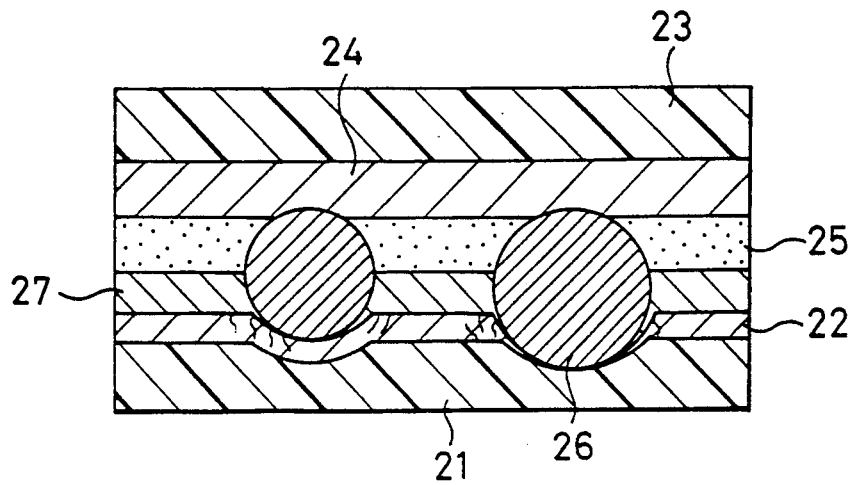
FIG. 10 is a sectional side view to show an example of connection between a panel substrate and a drive circuit substrate in which conventionally used conductive particles are employed.

FIG. 10 shows an example using conventional particles 26. In FIG. 10, a conductive particle 26 breaks a transparent electrode 22 on the right side and another particle makes cracks in the transparent electrode 22 on the left side, because the polymer film substrate 21 softer than the conductive particles 26. Such damages cause unstable contact between the polymer film substrate and the conductive particles due to a difference in thermal expansion and contraction between the materials after aging. This results in poor contact between the materials. In FIG. 10, referential numeral 23 denotes a drive circuit substrate, 24 a wire on the drive circuit substrate, 25 a hotmelt adhesive, and 27 an ultraviolet-curing adhesive.

The wiring terminals 5a of the drive circuit substrate 4 are aligned with the transparent electrode terminals 3a of the lower substrate 1. The thus-aligned terminals 5a, 3a are stuck to each other from the state of FIGS. 1 and 2 for primary temporary fix. After the primary temporary fix, a defect inspection is carried out. If there is a defect, the drive circuit substrate 4 is separated from the lower substrate 1 for reuse. Upon the separation, there is no transfer of the conductive particles 7 onto the lower substrate 1. According to such an arrangement, the defect inspection may be readily conducted and the lower substrate 1 may be reused after separation from the drive circuit substrate 4.

The primary temporary fix is effected by tackiness of the ultraviolet-curing adhesive 6 in the present case. In detail, the transparent electrode terminals 3a on the lower substrate 1 are aligned with the wiring terminals 5a on the drive circuit substrate 4 and they are lightly pressed at the connection portion. A tack strength of the ultraviolet-curing adhesive 6 keeps the connection during operations to follow. Accordingly, there is no need of external heat-press by a thermal head at the connection portion between the lower substrate and the drive circuit substrate, which is the case in the conventional primary fix.

After the primary temporary fix, the connection portion between the lower substrate and the drive circuit substrate is heat-pressed for five seconds under a pressure of 10 kg/cm² by a thermal head of 80° C. for secondary temporary fix. It is preferable for secondary primary fix that the temperature of thermal head is lower than a glass transition point and a softening point of the substrate. The hotmelt adhesive 8 is a heat seal connector (monosotropic type) manufactured by NIPPON GRAPHITE, which is not classified either into thermoplastic resins or into thermo-setting resins. The heat seal connector reveals fluidity at a temperature of 80° C. to provide adhesivity.

An inspection is conducted for connection between the lower substrate and the drive circuit substrate in the state of secondary temporary fix. If the inspection finds a defect of connection, the lower substrate 1 and the drive circuit substrate 4 are separated from each other at the connection portion, separating the connection portion of the lower substrate 1 through the hotmelt adhesive 8. This separation requires no extra process, but only a simple manual stripping. The terminals 3a of transparent electrodes (ITO) are not stripped off upon the separation, because there is the ultraviolet-curing adhesive 6 provided between the terminals. Unless the ultraviolet-curing adhesive 6 is interposed, most of the transparent electrodes (ITO) would be stripped off in the connection portion, because a bonding strength between a transparent electrode (ITO) terminal and a hotmelt adhesive is stronger than that between a transparent electrode (ITO) terminal and a polyester substrate. The existence of the ultraviolet-curing adhesive 6 is effective to avoid damage to the transparent electrode (ITO) terminals 3a from the conductive particles 7.

In the secondary temporary fix, a press of the connection portion between the lower substrate and the drive circuit substrate deforms the lower substrate 1 of polymer film to bring the conductive particles 7 into contact with the transparent electrode (ITO) terminals 3a. Contact portions in the transparent electrode (ITO) terminals 3a with the conductive particles 7 remain non-conductive stripped portions 9a as shown in a plan view of FIG. 8 after the transparent electrode terminals 3a are separated from the terminals on the drive circuit substrate. The non-conductive stripped portions 9a formed on the transparent electrode (ITO) terminals 3a do not cause any problem for reuse of the lower substrate 1.

Figure 9:
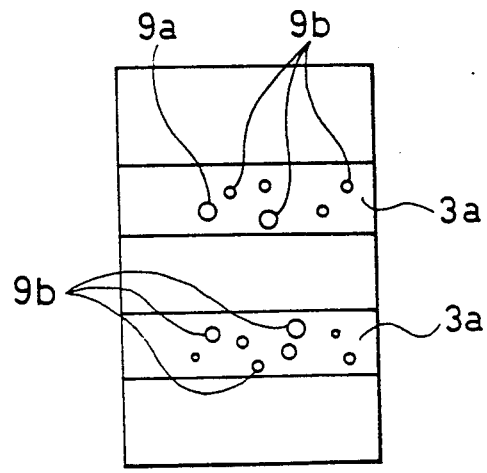
FIG. 9 is a plan view to show a connection portion after reconnection on a transparent electrode surface of panel substrate stripped after temporary fix between a panel substrate and a drive circuit substrate.

Once the conductive particles are strongly embedded into the wiring terminals 5a on the drive circuit substrate, the conductive particles remain in the wiring terminals 5a after the separation of connection portion, which facilitates observation of state on the transparent electrode (ITO) terminals 3a on the lower substrate 1. When the transparent electrode (ITO) terminals 3a of the lower substrate 1 are reused, the conductive particles 7 on the side of wiring terminals 5a on the drive circuit substrate may be connected at different positions 9b from the non-conductive stripped portions 9a in the transparent electrode (ITO) terminals 3a, as shown in FIG. 9. Thus a size of conductive particles 7 should be chosen to be smaller than a width of the wiring terminals 5a and the electrode terminals 3a.

Figure 3:
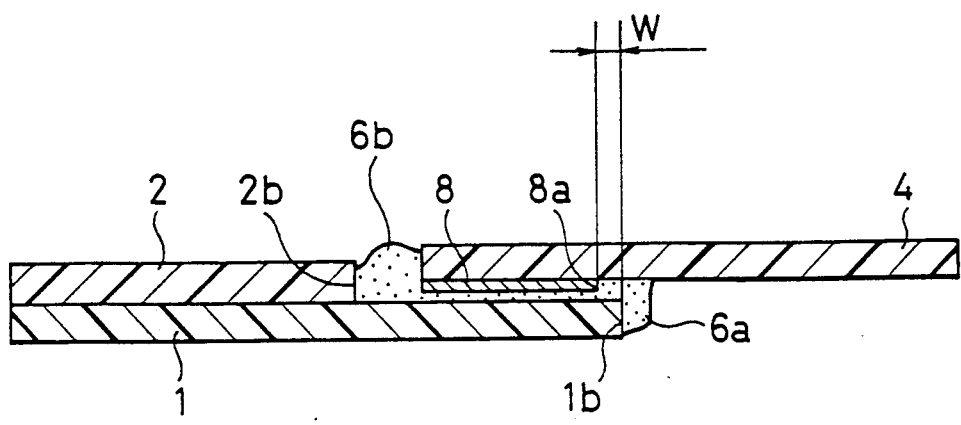
FIG. 3 is a schematic side view to show a state after connection in the first embodiment as shown in FIG. 1.

If there is no defect found in the connection portion upon the inspection, the connection portion is further pressed and an ultraviolet light is irradiated on the side of the lower substrate 1, as well as on the other side. Major irradiation of the ultraviolet light is on the side of the lower substrate 1, because transmission of ultraviolet light is insufficient through the drive circuit substrate 4 with the hotmelt adhesive 8. The irradiation on the side of the drive circuit substrate 4 is for hardening the ultraviolet-curing adhesive 6a, 6b pushed out of the edges 1b, 2b of the electrode taking-out portion on the substrate as shown in FIG. 3.

Figure 11:
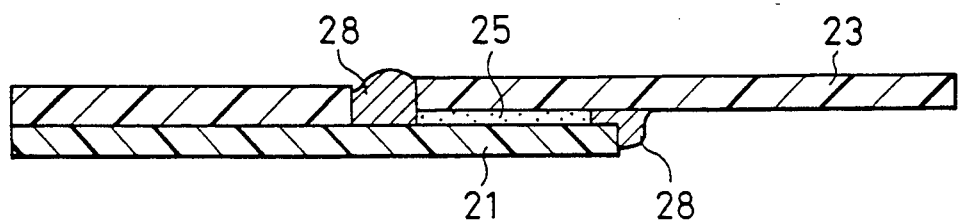
FIG. 11 is a side view to show an example of conventional protection of hotmelt adhesive against outside air after connection between a panel substrate and a drive circuit substrate.

The hotmelt adhesive 25 is likely to gradually deteriorate due to the influence of outside air. Therefore, there was means conventionally provided as shown in FIG. 11 for covering surroundings of the hotmelt adhesive 25 in a laminated portion for connection between the panel substrate 21 and the drive circuit substrate 23 with another adhesive 28 such as silicone resin, epoxy resin, and the like.

In the present embodiment, by the pressing at the connection portion, the ultraviolet-curing adhesive 6 located between the lower substrate 1 and the drive circuit substrate 4 is pushed out to cover the end face 1b of the lower substrate 1 and the end face 2b of the upper substrate, preventing the hotmelt adhesive 8 from being in contact with the outside air. In the connection portion between the lower substrate 1 and the drive circuit substrate 4, the edge 8a of the hotmelt adhesive 8 is located inside by a predetermined distance W with respect to an end face 1b of the lower substrate 1.

While the connection portion is pressed with irradiation of ultraviolet light, the ultraviolet-curing adhesive 6 enters a spacing between the conductive particles 7 and the transparent electrode terminals 3a to give strong adhesion in the connection portion. If the hotmelt adhesive is an adhesive mass or a thermoplastic adhesive, the contact is ended by hardening with irradiation of ultraviolet light after the temporary fix. If a thermo-setting adhesive is used, it must be further heat-pressed for thermal hardening before the irradiation of ultraviolet light.

Figure 4:
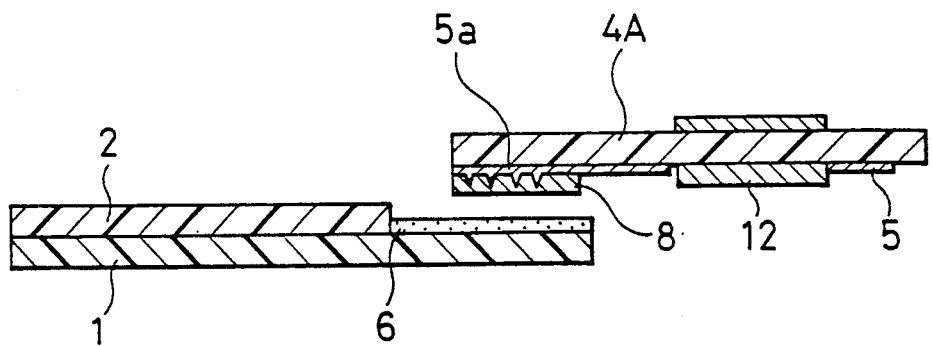
FIG. 4 is a schematic side view to show a state before connection between a panel substrate and a drive circuit substrate in the second embodiment according to the present invention.
Figure 5:
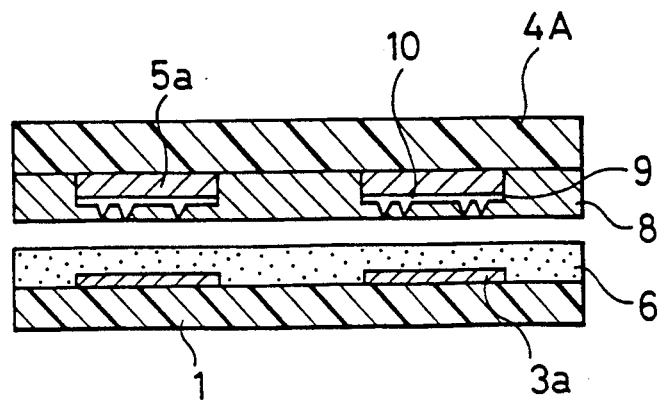
FIG. 5 is a partly enlarged drawing of the second embodiment as shown in FIG. 4.

FIGS. 4 and 5 show the second embodiment according to the present invention. The second embodiment is different from the first embodiment in that a TAB (Tape Automated Bonding) substrate is used as a drive circuit substrate, in which a Ni layer 9 and Au projections 10 are formed by electroplating on a surface of wiring terminals 5a made of Cu on the TAB substrate 4A. Numeral 12 denotes an LSI provided on the TAB substrate 4A. The structure on the side of the lower substrate 1 is the same as in the first embodiment.

Figure 8:
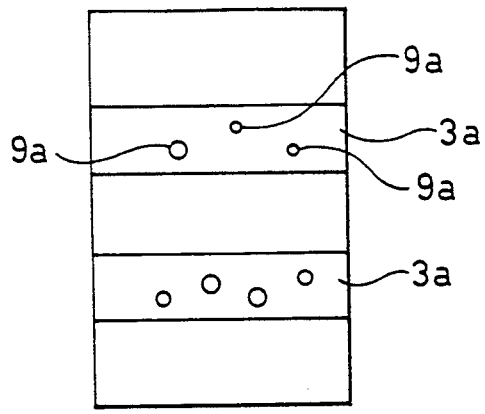
FIG. 8 is a plan view to show a surface condition of transparent electrode on a panel surface which has been separated after temporary fix between a panel substrate and drive circuit substrate.

The transparent electrode terminals 3a of the lower substrate 1 are connected to the wiring terminals 5a of the TAB substrate 4A with tackiness of ultraviolet-curing adhesive 6 for primary temporary fix. The secondary temporary fix is effected by heat-pressing the hotmelt adhesive 8 by a thermal head. Upon the secondary temporary fix, the Au projections 10 formed on the surface of the wiring terminals 5a contact the transparent electrode terminals 3a on the lower substrate 1. Non-conductive stripped portions 9a are formed after stripping similarly as in the case of conductive particles as shown in FIG. 8. The TAB substrate 4A is stripped off if rejected by an inspection after the secondary temporary fix. The Au projections 10 formed on the wiring terminals 5a of the thus-stripped TAB substrate 4A should be located at positions offset from Au projections 10 formed on wiring terminals 5a of a TAB substrate 4a to be next connected.

Figure 6:
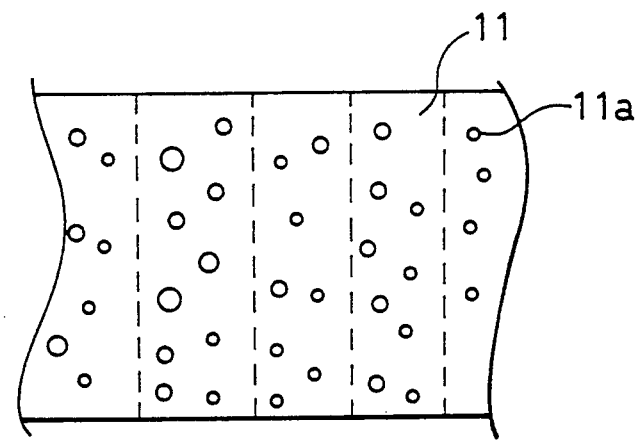
FIG. 6 is a plan view of metal mask for forming projections on an electroplated layer in the second embodiment.

A metal mask 11 with mask holes 11a formed therein as shown in FIG. 6 is used as means for forming the Au projections 10 electroplated. The positions of Au projections 10 formed on the wiring terminals 5a on the TAB substrate 4A may be arbitrarily chosen by preparing a plurality of metal masks 11 different in position from mask holes 11a.

Figure 7:
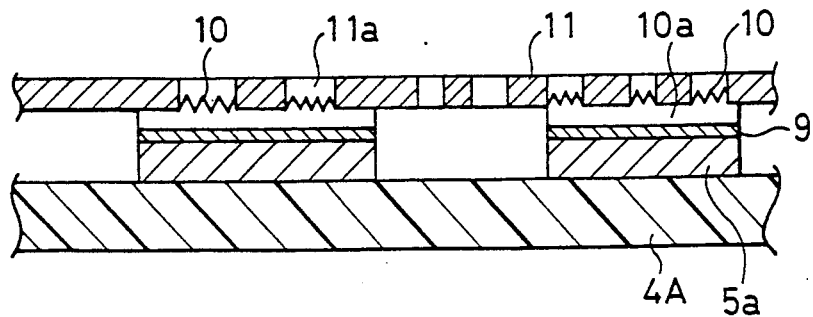
FIG. 7 is a side view to show a formation of projections on an electroplated layer using the metal mask of FIG. 6.

The Au projections 10 may be formed as follows on the surface of wiring terminals 5a made of Cu on the TAB substrate 4A. A Ni layer 9 and an Au layer 10a are first formed by electroplating on the surface of wiring terminals 5a. A metal mask 11 with random holes 11a, which has a thickness greater than the height of projections to be formed, is mounted on the Au layer 10a. Then the metal mask 11 is pressed towards the Au layer 10a as shown in FIG. 7. The Au layer 10a has Au projections 10 at positions corresponding to the mask holes 11a in the metal mask 11.

Accordingly, replacing the TAB substrate 4A rejected upon inspection, another TAB substrate 4A may be used with Au projections 10b formed by another metal mask 11 different in position of mask holes 11a for retrail of connection. The reconnection may have the connection positions as shown in FIG. 9.

Many widely different embodiments of the present invention may be constructed without departing from the spirit and scope of the present invention. It should be understood that the present invention is not limited to the specific embodiments described in the specification, except as defined in the appended claims.

What is claimed is:

1. A liquid crystal display device in which a flexible film is used as a panel substrate and in which a transparent electrode terminal formed on said panel substrate in connected to a wiring terminal formed on a drive circuit substrate wherein:

a radiation-setting adhesive is coated on a surface of a connection portion forming the transparent electrode terminal of the panel substrate;

a conductive member is projectively provided on a surface of a connection portion forming the wiring terminal of the drive circuit substrate;

a hotmelt adhesive covers a surface of the drive circuit substrate including the conductive member; and said hotmelt adhesive softens at a temperature below a glass transition point of a polymer film for said panel substrate.

2. A liquid crystal display device according to claim 1, wherein a polymer film is used for said panel substrate, and said conductive member projectively provided on said connection portion surface is conductive particles embedded in the surface of the wiring terminal.

3. A liquid crystal display device according to claim 1, wherein a polymer film is used for said panel substrate, and said conductive member projectively provided on said connection portion surface is projections formed by plating of conductive material over the surface of the wiring terminal.

4. A liquid crystal display device according to claim 1, wherein the conductive member projectively provided on the connection portion surface of said wiring terminal occupies a part of area of said connection portion surface.

5. A liquid crystal display device according to claim 1, wherein the connection between said wiring terminal and said transparent electrode terminal is effected through a connection between the conductive member projectively provided on said surface of wiring terminal and the transparent electrode terminal on a polymer film deformed by pressure upon connection.

6. A liquid crystal display device according to claim 1, wherein said radiation-setting adhesive does not only cover said surface of connection portion, but also surroundings of the transparent electrode terminal and of the wiring terminal.

7. A liquid crystal display device according to claim 1, wherein an end of the hotmelt adhesive is located inside by a predetermined distance with respect to an edge of the panel substrate when said panel substrate and the drive circuit substrate are laminated.

8. A liquid crystal display device according to claim 1, wherein said radiation-setting adhesive is an ultraviolet-curing adhesive.

9. A liquid crystal display device according to claim 1, wherein said radiation-setting adhesive is a photo-setting adhesive.

10. A process for producing a liquid crystal display device in which a flexible film is used as a panel substrate and in which a transparent electrode terminal formed on said panel substrate is connected to a wiring terminal formed on a drive circuit substrate, comprising:

coating a radiation-setting adhesive on a surface of a connection portion forming the transparent electrode terminal of the panel substrate;

projectively providing a conductive member on a surface of a connection portion forming the wiring terminal of the drive circuit substrate;

covering a surface of the drive circuit substrate including said conductive member with a hotmelt adhesive;

heat-pressing the connection surfaces of the panel substrate and the drive circuit substrate positioned with each other at a temperature below a glass transition point of the panel substrate to remove most of said radiation-setting adhesive therefrom to connect the transparent electrode terminal through said conductive member projectively provided to the wiring terminal in a temporary fix state;

inspecting the device; and alternatively selecting a step to follow based on a result of the inspection from:

effecting a final hardening of said radiation-setting adhesive for connection; and breaking the temporary fix state then to connect said panel substrate to another drive circuit substrate in said above steps.

11. A process for producing a liquid crystal display device according to claim 10, wherein the hotmelt adhesive is a thermosetting adhesive, said adhesive is hardened under hardening conditions thereof after the temporary fix, and thereafter said radiation-setting adhesive is hardened by radiation.

12. A process for producing a liquid crystal display device according to claim 10, wherein said conductive member projectively provided is formed by depositing an electroplated layer on said surface of wiring terminal of the drive circuit substrate and placing to press a mask with random holes on said electroplated layer.

13. A process for producing a liquid crystal display device according to claim 10, wherein said radiation-setting adhesive is an ultraviolet-curing adhesive.

14. A process for producing a liquid crystal display device according to claim 10, wherein said radiation-setting adhesive is a photo-setting adhesive.

* * * * *